United States Patent [19]
Kapur et al.

[11] Patent Number: 5,691,990
[45] Date of Patent: Nov. 25, 1997

[54] HYBRID PARTIAL SCAN METHOD

[75] Inventors: Rohit Kapur, Foster City, Calif.; Thomas J. Snethen, Endwell; Kamran K. Zarrineh, Endicott, both of N.Y.

[73] Assignee: International Business Machines Corporation, Armonk, N.Y.

[21] Appl. No.: 759,286

[22] Filed: Dec. 2, 1996

[51] Int. Cl.$^6$ ........................................ G06F 11/00
[52] U.S. Cl. ........................ 371/22.3; 395/186.03
[58] Field of Search ........................ 371/22.3, 22.5, 371/22.6; 395/183.06; 324/156 R

[56] References Cited

U.S. PATENT DOCUMENTS

| | | |
|---|---|---|
| 4,710,931 | 12/1987 | Bellay et al. . |
| 4,860,290 | 8/1989 | Daniels et al. . |
| 4,872,169 | 10/1989 | Whetsel, Jr. . |
| 5,043,986 | 8/1991 | Agrawal et al. . |
| 5,150,044 | 9/1992 | Hashizume et al. . |
| 5,329,533 | 7/1994 | Lin . |
| 5,448,575 | 9/1995 | Hashizume . |
| 5,450,414 | 9/1995 | Lin . |

OTHER PUBLICATIONS

TOPS: A Target–Oriented Partial Scan Design Package Based on Simulated Annealing, VLSI Design, 1994, vol. 2, No. 3, pp. 233–239.

Partial Scan Flip–Flop Selection by Use of Empirical Testability, Journal of Electronic Testing: Theory and Application, 7, 47–49 (1995).

*Primary Examiner*—Vincent P. Canney
*Attorney, Agent, or Firm*—Peter W. Peterson; DeLio & Peterson, LLC; H. Daniel Schnurmann

[57] ABSTRACT

An efficient method of selecting flip-flops to be made scannable in a digital integrated circuit design for purposes of improving testability without incurring the overhead of full-scan, comprising the steps of (a) partitioning the faults in the circuit into a first fault type and a second fault type, (b) selecting a static characterization algorithm for characterizing the first and second fault types, (c) determining the relationship between attainable fault coverage and the characterized values for the first and second fault types, (d) characterizing the first and second fault types for each candidate flip-flop for scan in the digital integrated circuit with the static characterization algorithm, (e) determining the first and second fault types that are the closest together in value, (f) selecting the flip-flop associated with the first and second fault types determined in step (e), (g) forming a shift register with flip-flop selected in step (f), (h) repeating steps (d)–(g) until the attainable fault coverage determined in step (c) is attained, and (i) generating test data for the network with the shift register configured in step (h).

13 Claims, 2 Drawing Sheets

CHANGING CHARACTERISTICS OF THE HARD FAULTS

HYBRID PARTIAL SCAN METHOD

BACKGROUND OF THE INVENTION

1. Field of the Invention

The present invention pertains to a partial scan technique for testing integrated logic circuits.

2. Problem to be Solved

With the increase in density of integrated electronic circuits, the complexity and testing and, more significantly, the cost associated with the testing of such circuits has, likewise, also increased. In order to reduce the costs and complexity of testing digital integrated circuits, various methods of testing such circuits have been developed. One such method is a full scan test, of which there are many embodiments. One such embodiment is the Level Sensitive Scan Design which is described in U.S. Pat. No. 3,761,695. To reduce the amount of dedicated test circuitry required to implement scan design, partial scan design has gained favor, in which some memory elements (flip-flops or latches) are allowed to remain non-scannable in the test mode. Thus, a tradeoff exists between testability, which is enhanced by making more flip-flops scannable, and circuit overhead, which is minimized by making fewer flip-flops scannable.

Partial scan testing entails partitioning the circuit such that selected sequential elements, i.e., flip-flops, in the circuit are arranged as a shift-register. Initially, the circuit is placed in a test mode, and a known stream of test data is shifted into the shift register configured of the selected flip-flops. The selected flip-flops are also referred to as "scan" flip-flops. Thereafter, the integrated circuit is placed in its normal operating mode so as to respond to the test data. Finally, the integrated circuit is returned to test mode and the test data, as modified by the operation of the integrated circuit, is shifted out from the scan flip-flops for comparison to a reference data stream.

Selection of the specific flip-flops to be scannable and the number of these flip-flops have become important logic design problems. There are several different conventional approaches for solving these problems. The analysis of global feedback loops and selection of flip-flops to break such loops are described in U.S. Pat. No. 5,043,986. In U.S. Pat. No. 5,502,730, scannable flip-flops are selected so as to break reconvergence paths. In U.S. Pat. No. 5,291,495, a test pattern generator is run, and the propagation of test values for untested faults is recorded so that flip-flops can be selected for scan, thereby making these test values observable. U.S. Pat. No. 5,305,328 discloses a technique that uses test pattern generation. For untested faults, the technique effects recordation of the internal state required to test the faults and selection of the required flip-flops to be scannable. Static controllability and observability analysis is disclosed in U.S. Pat. No. 5,450,414 to identify points that need to be scanned to render faults more highly testable.

Attempts to minimize the number of scannable flip-flops required to attain a desired measure of testability have led to incremental approaches where a "best" flip-flop is selected for scan. The analysis is then repeated and the second "best" flip-flop is selected. This process continues until either all flip-flops have been selected or the desired measure of testability is reached. In "A Fault Oriented Partial Scan Design Approach", Proceedings of the International Conference on Computer-Aided Design, November 1991, pp. 400–403, V. Chickermane and J. H. Patel describe the use of SCOAP to determine the most "profitable" flip-flop to make the design scannable. This process is also described in "Controllability/Observability Analysis of Digital Circuits," by L. H. Goldstein, IEEE Transactions on Circuits and Systems, vol. 26, pp. 685–693, 1979. After selecting some number of the most profitable flip-flops for scan, the analysis is repeated to select additional flip-flops until the analysis shows that the desired testability measure has been achieved.

The use of static analysis methods such as SCOAP has the drawback that such measures never correlate exactly with the results of a given test pattern generator. This means that a partial scan design, wherein the selection of scannable flip-flops is based on a static analysis approach, may have some faults that are hard to test with the particular test pattern generator that will be used to produce the tests for the design. On the other hand, the use of a test pattern generator during the scan flip-flop selection process is expensive, especially when an iterative approach is used to optimize the selection process.

It is therefore an object of the present invention to provide a new and improved scan flip-flop selection method that reduces the time required to select the scan flip-flops, uses the incremental approach to optimize selection and ensures that the test generator performs optimally on the resulting design.

Still other objects and advantages of the invention will in part be obvious and will in part be apparent from the specification.

SUMMARY OF THE INVENTION

The above and other objects and advantages, which will be apparent to one skilled in the art, are achieved in the present invention which is directed to, in a first aspect, a method for testing a digital integrated circuit having a plurality of flip-flops comprising the steps of:

a) partitioning the faults in the circuit into a first fault type and a second fault type;

b) selecting a static characterization algorithm for characterizing the first and second fault types;

c) determining the relationship between attainable fault coverage and the characterized values for the first and second fault types;

d) characterizing the first and second fault types for each candidate flip-flop for scan in the digital integrated circuit with the static characterization algorithm;

e) determining the first and second fault types that are the closest together in value;

f) selecting the flip-flop associated with the first and second fault types determined in step (e);

g) forming a shift register with the flip-flop selected in step (f);

h) repeating steps (d)–(g) until the attainable fault coverage determined in step (c) is attained; and i) generating test data for the network with the shift register configured in step (h).

In a related aspect, the present invention is directed to a method for testing a digital integrated circuit having a plurality of flip-flops comprising the steps of:

a) partitioning the faults in the circuit into a first fault type and a second fault type;

b) selecting a static characterization algorithm for characterizing the first and second fault types, the selecting comprising the steps of:

providing a set of static characterization algorithms, calculating a characteristic Ce for all the faults of the first type, as a class, according to each algorithm provided in the providing step, calculating a characteristic Ch for all the faults of the second type, as a class, according to each algorithm provided in the providing step, and determining which algorithm yields the maximum ratio of Max(Ce,Ch)/Min(Ce,Ch), c) determining the relationship between attainable fault coverage and the characterized values for the first and second fault types;

d) characterizing the first and second fault types for each candidate flip-flop for scan in the digital integrated circuit with the selected static characterization algorithm;

e) determining the first and second fault types that are the closest together in value;

f) selecting the flip-flop associated with the first and second fault types determined in step (e);

g) forming a shift register with the flip-flop selected in step (f);

h) repeating steps (d)–(g) until the attainable fault coverage determined in step (c) is attained; and i) generating test data for a network with the shift register configured in step (h).

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

In describing the preferred embodiment of the present invention, reference will be made herein to FIGS. 1 and 2 in which like numerals refer to like features of the invention.

Figure 1:
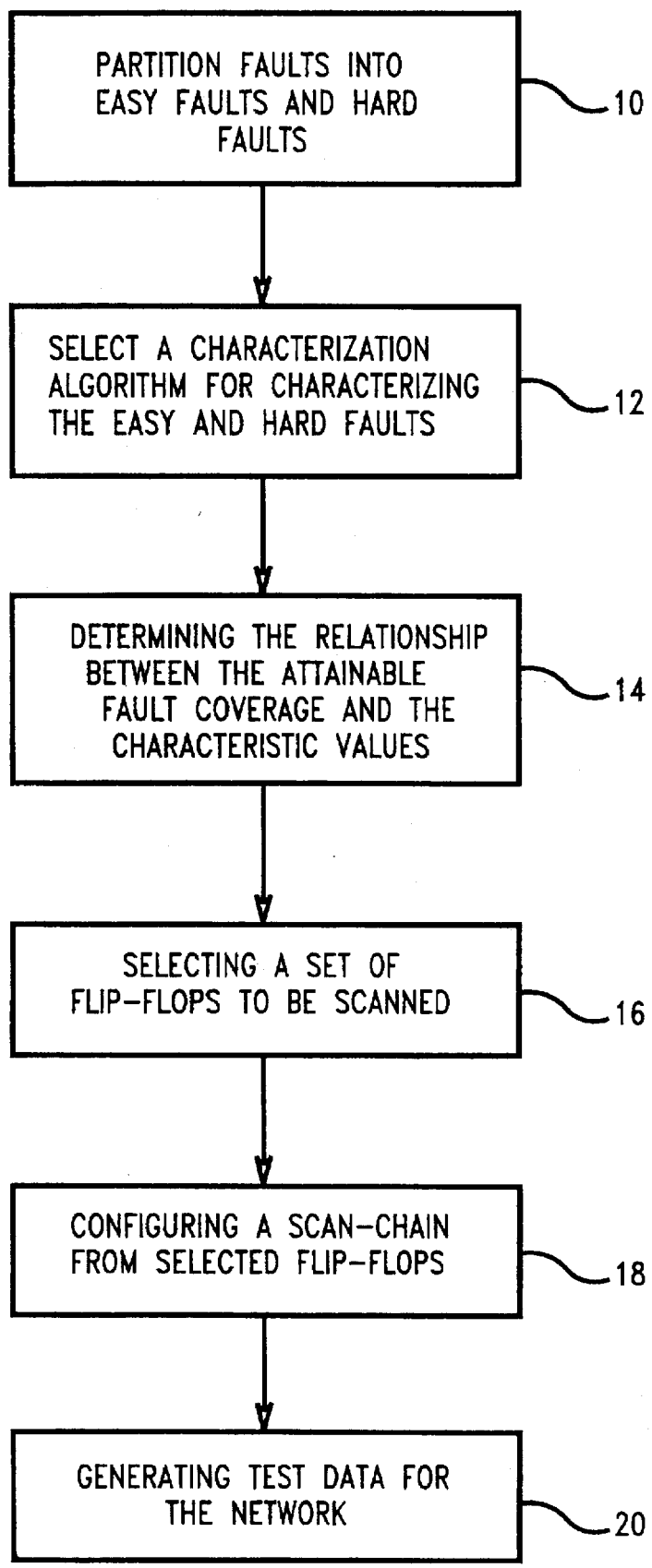
FIG. 1 is a flow diagram illustrating the method of the present invention.

Referring to FIG. 1, the method of the present invention starts at step 10. In step 10, the test pattern generator is enabled to produce a predetermined test pattern with relatively low effort on all faults in the circuit. Step 10 partitions the fault list into two sets: (i) "easy" faults, and (ii) "hard" faults. The criterion for determining whether a fault is an easy fault or a hard fault is based upon the particular fault's detection status. Specifically, if a fault is detected with a given test pattern, it is considered an easy fault. On the other hand, if the fault is not detected with any test pattern, the fault is a hard fault. The number of easy faults is represented by Fe and the number of hard faults is represented by Fh. The test pattern can be any type of pattern. Even random test patterns may be used. In order to obtain optimum results, it is preferred that the test generator used in step 10 is the same test generator that will be used to generate the final tests on the partial scan design in step 20 below.

To appreciate the purpose of step 12, it is necessary to understand that the flip-flop selection process of step 16 selects, in an incremental fashion, the flip-flop that will most improve testability by being scanned. To make this determination, some measure of testability must be used. Moreover, to achieve the goal of ensuring that the test generator used in step 20 can perform optimally on the resulting design, this testability measure must correlate as closely as possible with the results of the test generator used in step 20. This correlation would be perfect if one were to use the same test generator in both steps 16 and 20, but this is not feasible because of the long time it would take to run the test generator repeatedly in step 16. Therefore, a static characterization algorithm which runs very quickly is chosen to produce the testability measure required in step 16. Inasmuch as there is no static characterization algorithm that will give perfect correlation with any given test pattern generator, and inasmuch as there are many static characterization algorithms which could be used, step 12 comprises an experiment to select, from all the available static characterization algorithms, the static characterization algorithm that gives the best correlation with the test pattern generator for the given circuit. The fault categorization resulting from step 10 is used for this purpose, and this is why it is preferred that the same test pattern generator be used in steps 10 and 20. As stated above, there are many static characterization algorithms that may be used. One such algorithm is described in "A Cost-Based Approach to Partial Scan" by P. S. Parikh and M. Abramovici, 30th ACM/IEEE Design Automation Conference Proceedings, June, 1993, pp. 255–259, which generates a testability measure based on sequential depth (the number of memory elements situated between the fault and the controllable and observable points, which are the scannable latches and primary pins of the circuit). Another such algorithm is SCOAP, which gives a finer-grained measure, taking into account not only the sequential elements in the circuit but also the complexity of the combinational logic. The method of the present invention produces optimum results when there is a large variety of different algorithms from which to choose because this increases the chance that one of the algorithms will correlate well with the test generator for the given logic circuit. The following methodolgy is implemented to select a static characterization algorithm from the set of static characterization algorithms that are at the disposal of the practitioner of the present invention:

a) a characteristic (Ce) for all the easy faults, as a class, and a characteristic (Ch) for all the hard faults, as a class, are calculated according to each algorithm in the set of possible static characteristic algorithms. For example, if a particular algorithm calculates the number of inputs of the network controlling the detection of faults, then Ce is the average number of such inputs for all easy faults and Ch is the average number of such inputs for the hard faults. As a result of implementing each algorithm, several (Ce, Ch) pairs are computed; and b) it is then determined which algorithm yields the maximum ratio Max(Ce,Ch)/Min(Ce,Ch) wherein "Max" and "Min" refer to maximum and minimum, respectively.

Considering the same algorithm as an example, assume the average number of inputs to control for easy faults to be 10 (i.e., Ce). Similarly, assume the average number of inputs to control for hard faults to be 60 (i.e., Ch). Then, the ratio: Max (10,60)/Min(10,60) is equal to 60/10=6. The algorithm yielding the maximum ratio Max(Ce,Ch)/Min(Ce,Ch) is considered the best testability estimator for the given network.

In step 14, the relationship between fault coverage and the characteristic values is determined. This is accomplished by using a linear approximation to estimate the attainable fault coverage from the characteristics determined in step 12. Although the correlation between the selected characteristics and test coverage may not be 100%, and the relationship may not be linear, a linear approximation is still useful for evaluating the effect of selecting each individual flip-flop for scanning. The attainable fault coverage is determined by the linear equation:

$$\text{Fault Coverage} = (Fe + ((Ch' - Ch)/(Ce - Ch))Fh)/(Fe + Fh),$$

wherein Fe represents the number of easy faults, Fh represents the number of hard faults, Ce is the characteristic of the easy faults determined by the selected characterization algorithm, Ch is the characteristic of the hard faults determined by the selected characterization algorithm, and Ch' is the new value for Ch that is calculated by the static characteristic algorithm when a particular flip-flop is selected to be part of the scan-chain, i.e., the shift register (see step 16 below).

Figure 2:
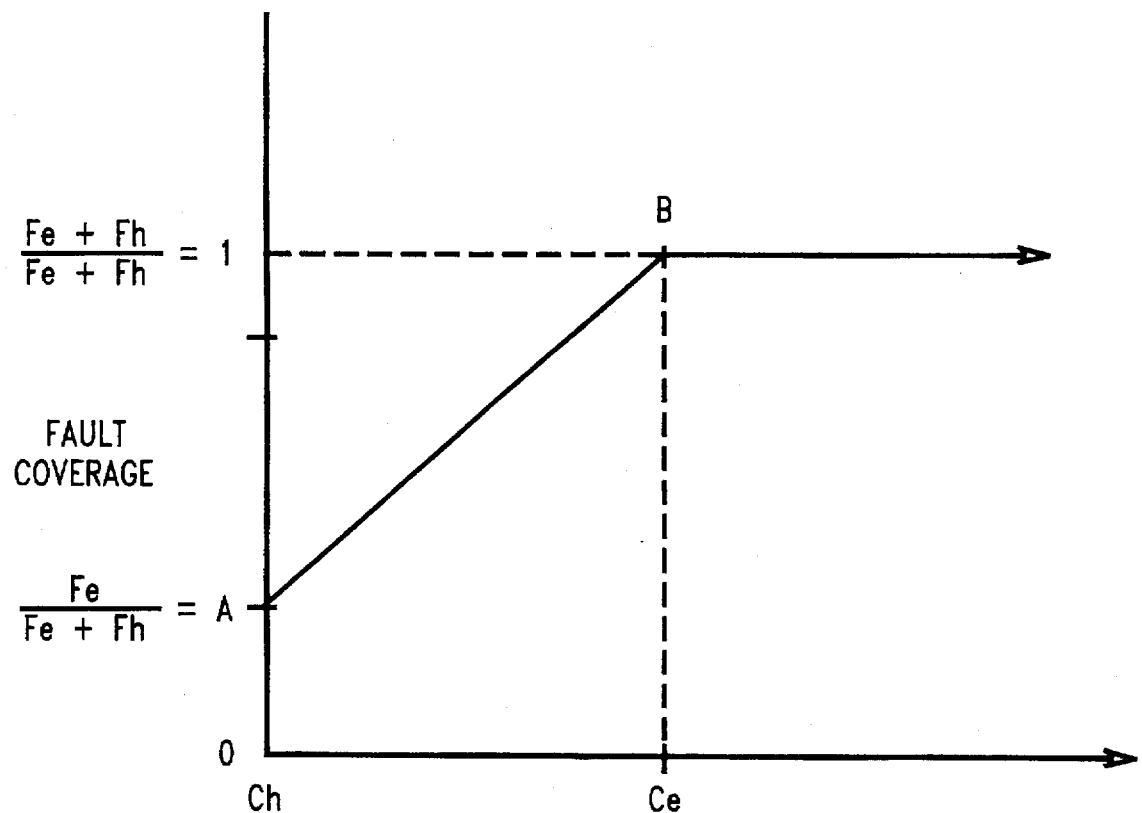
FIG. 2 is a graph illustrating the relationship between attainable fault coverage versus the characteristics value as determined for the hard to detect faults.

Referring to FIG. 2, the linear equation for determining Fault Coverage is derived from two end-points. One endpoint of the linear equation is the starting point wherein no flip-flops have been selected and Ch'=Ch (Ch being the initial value). For this end-point, the acceptable fault coverage is equal to Fe/(Fe+Fh) and is represented by letter A in FIG. 2. At the other end-point, Ch' is approximately equal to Ce and the attainable fault coverage is equal to (Fe+Fh)/(Fe+Fh) which is represented by letter B in FIG. 2. Thus, the attainable fault coverage is equal to 100%. This fault coverage may be attained by making only part of the flip-flop scanable.

Step 16 effects selection of a minimal set of flip-flops in order to achieve a user specified target fault coverage, i.e., a specified attainable fault coverage. The flip-flops are incrementally added to the scan-chain, i.e., the shift register. Each time a candidate flip-flop for scan is selected, the static characterization algorithm is run to compute a new value Ch' for the hard to detect faults. Whether a particular flip-flop is eventually selected for the scan-chain is determined by its effect on the value of Ch and the closeness of Ch to Ce. All candidate flip-flops are evaluated one at a time and a Ch' is determined by assuming that flip-flop is made scanable. Specifically, the flip-flop selected for scan is the one which has a significant effect in making Ch close to Ce.

By way of example and referring to FIG. 2, if there are one-hundred (100) flip-flops available, the first step is to choose the best, first flip-flop that has the most significant or maximum effect in making Ch close to Ce. In the next iteration, there are ninety-nine (99) remaining flip-flops and Ch has a new value as a result of the selection of the first flip-flop. The best, second flip-flop of the scan-chain having the most significant effect in making Ch close to Ce is selected from the remaining ninety-nine (99) flip-flops. These steps are continued until Ch' is approximately equal to Ce. As previously explained, the desired fault coverage is attained when Ch' is approximately equal to Ce. When this occurs, the fault coverage is approximately equal to (Fe+Fh)/(Fe+Fh). Once Ch is substantially close to Ce, test pattern generation will be successful for all faults. The process of incrementally selecting flip-flops for scanning is complete when the attainable fault coverage is attained.

Step 18 entails configuring the flip-flop into the desired scan-chain, i.e., the shift register. Values can be injected into the flip-flops in the scan-chain from a tester which make them directly controllable. In addition, values inside the scanable flip-flops can be downloaded by the tester and observed.

In step 20, the known test data is generated by the test pattern generator for the network that includes the "shift register" that is comprised of the selected flip-flops.

While the present invention has been particularly described, in conjunction with a specific preferred embodiment, it is evident that other alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for testing a digital integrated circuit having a plurality of flip-flops comprising the steps of:
   a) partitioning the faults in the circuit into a first fault type and a second fault type;
   b) selecting a static characterization algorithm for characterizing the first and second fault types;
   c) determining the relationship between attainable fault coverage and the characterized values for the first and second fault types;
   d) characterizing the first and second fault types for each candidate flip-flop for scan in the digital integrated circuit with the static characterization algorithm;
   e) determining the first and second fault types that are the closest together in value;
   f) selecting the flip-flop associated with the first and second fault types determined in step (e);
   g) forming a shift register with the flip-flop selected in step (f);
   h) repeating steps (d)–(g) until the attainable fault coverage determined in step (c) is attained; and
   i) generating test data for the network with the shift register configured in step (h).

2. The method according to claim 1 wherein in the partitioning step (a), the first type faults are classified as easy faults and the second type faults are classified as hard faults.

3. The method according to claim 1 wherein each fault has a detection status indicating whether the fault has been detected or not detected, the partitioning step (a) comprising the step of determining the detection status of each fault.

4. The method according to claim 1 wherein selecting step (b) comprises the step of providing a set of static characterization algorithms.

5. The method according to claim 1 wherein selecting step (b) further comprises the steps of:
   j) calculating a characteristic Ce for all the faults of the first type, as a class, according to each algorithm provided in the providing step;
   k) calculating a characteristic Ch for all the faults of the second type, as a class, according to each algorithm provided in the providing step; and
   l) determining which algorithm yields the maximum ratio of Max(Ce,Ch)/Min(Ce,Ch).

6. The method according to claim 1 wherein the digital integrated circuit comprises N flip-flops and characterizing step (d) comprises the step of calculating characteristics Ce and Ch' for each candidate flip-flop in the set of N flip-flops with the selected static characteristic algorithm wherein Ch' is a new value of Ch and wherein such calculations are based on the assumption that the candidate flip-flop is scanable.

7. The method according to claim 6 wherein determining step (e) comprises the step of determining which new value Ch' is closest to Ce.

8. The method according to claim 7 wherein selecting step (f) comprises selecting the flip-flop associated with the new value Ch' determined in step (e) to be the next flip-flop in the scan-chain.

9. A method for testing a digital integrated circuit having a plurality of flip-flops comprising the steps of:
 a) partitioning the faults in the circuit into a first fault type and a second fault type;
 b) selecting a static characterization algorithm for characterizing the first and second fault types, the selecting step comprising the steps of:
  providing a set of static characterization algorithms,
  calculating a characteristic Ce for all the faults of the first type, as a class, according to each algorithm provided in the providing step,
  calculating a characteristic Ch for all the faults of the second type, as a class, according to each algorithm provided in the providing step, and
  determining which algorithm yields the maximum ratio of Max(Ce,Ch)/Min(Ce,Ch),
 c) determining the relationship between attainable fault coverage and the characterized values for the first and second fault types;
 d) characterizing the first and second fault types for each candidate flip-flop for scan in the digital integrated circuit with the selected static characterization algorithm;
 e) determining the first and second fault types that are the closest together in value;
 f) selecting the flip-flop associated with the first and second fault types determined in step (e);
 g) forming a shift register with the flip-flop selected in step (f);
 h) repeating steps (d)–(g) until the attainable fault coverage determined in step (c) is attained; and
 i) generating test data for a network with the shift register configured in step (h).

10. The method according to claim 9 wherein the digital integrated circuit comprises N flip-flops and characterizing step (d) comprises the step of calculating characteristics Ce and Ch' for each candidate flip-flop in the set of N flip-flops with the selected static characteristic algorithm wherein Ch' is a new value of Ch wherein such calculations are based on the assumption that the candidate flip-flop is scanable.

11. The method according to claim 10 wherein determining step (e) comprises determining which new value Ch' is closest to Ce.

12. The method according to claim 10 wherein selecting step (f) comprises the step of selecting the flip-flop associated with the new value Ch' determined in step (e) to be the next flip-flop in the scan-chain.

13. A method for testing a digital integrated circuit having N flip-flops comprising the steps of:
 a) partitioning the faults in the circuit into a first fault type and a second fault type;
 b) selecting a static characterization algorithm for characterizing the first and second fault types, the selecting step comprising the steps of:
  providing a set of static characterization algorithms,
  calculating a characteristic Ce for all the faults of the first type, as a class, according to each algorithm provided in the providing step,
  calculating a characteristic Ch for all the faults of the second type, as a class, according to each algorithm provided in the providing step, and
  determining which algorithm yields the maximum ratio of Max(Ce,Ch)/Min(Ce,Ch),
 c) determining the relationship between attainable fault coverage and the characterized values for the first and second fault types;
 d) characterizing the first and second fault types for each candidate flip-flop for scan by calculating characteristics Ce and Ch' for each candidate flip-flop with the selected static characteristic algorithm wherein Ch' is a new value of Ch;
 e) determining the first and second fault types that are the closest together in value by determining which new value Ch' is closest to Ce;
 f) selecting the flip-flop associated with the value Ch' determined in step (e);
 g) forming a shift register with the flip-flop selected in step (f);
 h) repeating steps (d)–(g) until the attainable fault coverage determined in step (c) is attained; and
 i) generating test data for a network having the shift register configured in step (h).

* * * * *